(12) United States Patent
Seki et al.

(10) Patent No.: US 6,313,622 B1
(45) Date of Patent: Nov. 6, 2001

(54) POWER SOURCE VOLTAGE CONTROLLER

(75) Inventors: Takahiro Seki; Katsunori Seno, both of Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/484,227

(22) Filed: Jan. 18, 2000

(30) Foreign Application Priority Data

Jan. 20, 1999 (JP) .................................................. 11-012379

(51) Int. Cl.[7] .................................................. G01R 25/00
(52) U.S. Cl. ...................................... 324/76.82; 324/76.54
(58) Field of Search ............................... 324/76.52, 76.5, 324/76.74, 76.77, 76.79, 619; 375/376

(56) References Cited

U.S. PATENT DOCUMENTS

| | | | |
|---|---|---|---|
| 4,404,520 | * | 9/1983 | Nichols .............................. 324/76.54 |
| 4,704,574 | * | 11/1987 | Nossen .............................. 324/76.82 |
| 5,351,000 | * | 9/1994 | Farwell .............................. 324/76.77 |
| 5,761,517 | * | 6/1998 | Durham et al. ....................... 713/322 |

* cited by examiner

Primary Examiner—Safet Metjahic
Assistant Examiner—Vincent Q. Nguyen
(74) Attorney, Agent, or Firm—Ronald P. Kananen; Rader, Fishman & Grauer

(57) ABSTRACT

A power source voltage controller which can set the optimal margin for a replica circuit and shorten the time for the power source voltage to converge to the optimal value, having a replica circuit for monitoring a delay time of a critical path by propagating a reference signal having a power source voltage-delay characteristic approximately equivalent to a critical path in a semiconductor circuit, a phase difference detection circuit and an encoder receiving a delay signal by the replica circuit and the reference signal and detecting the phase difference of the delay signal from the reference signal and outputting the detection result as phase difference information, voltage control circuits for generating a power source voltage of a value based on a phase difference information signal and supplying it to the semiconductor circuit and the replica circuit, and a delay error correction circuit arranged at the input side of the reference signal of the replica circuit and correcting the delay difference with the critical path.

22 Claims, 8 Drawing Sheets

POWER SOURCE VOLTAGE CONTROLLER

BACKGROUND OF THE INVENTION

1. Field of the Invention

The present invention relates to a power source voltage controller having a replica circuit for monitoring critical path delay of a semiconductor circuit.

2. Description of the Related Art

Recent semiconductor circuits generally are reduced in power consumption by the method of lowering a power source voltage $V_{DD}$.

This is because lowering the power source voltage is the most efficient for reducing the power consumption of a semiconductor circuit (LSI) since the AC component of the power consumption of the LSI is proportional to the square of the power source voltage.

From this viewpoint, the method has recently been reported of dynamically controlling the power source voltage to deal with the operating frequency of the LSI and the fluctuations in the process.

In a power source voltage controller using such a so-called variable power source voltage system, a replica circuit having the same power source voltage-delay characteristic as the critical path is provided, and the power source voltage is controlled while judging whether the replica circuit can normally operate.

An LSI using this variable power source voltage control system is extremely effective in reducing the power consumption of the LSI.

Summarizing the problems to be solved by the invention, since it is extremely difficult to reproduce the exact same effects due to layout and interconnection as an actual critical path in the replica circuit, it is necessary to operate the replica circuit by giving it a certain delay margin.

However, addition of a delay margin to the replica circuit leads to an increase of the operating power source voltage. An excessive margin results in less of an effect of the power source voltage control system.

Also, a power source voltage controller using a replica circuit uses a phase comparison system of comparing the phases of a clock signal propagated through the replica circuit and an original clock signal before propagation and controlling the power source voltage by an up or down signal in accordance with the result of the phase comparison in order that the delay of the replica circuit not exceed one cycle of the operating frequency.

In this phase comparison system, however, only information of whether the phase is advanced or delayed is obtained. Information of about how much phase difference there is cannot be obtained.

Accordingly, the steps by which the power source voltage step can be changed end up becoming fixed at a certain value no matter what the phase difference is.

The minimum step of the power source voltage becomes the amount of fluctuation of the power source voltage at the time of convergence, so the smaller the step width, the smaller the power source voltage fluctuation at the time of convergence, however, the time to the convergence becomes longer.

Accordingly, for more efficient use of the power source voltage system, a method for setting an optimal margin for a replica circuit and an apparatus realizing both a small power source voltage fluctuation and a short convergence time have been sought.

SUMMARY OF THE INVENTION

An object of the present invention is to provide a power source voltage controller which can set an optimal margin for a replica circuit, shorten a time for convergence of the power source voltage to the most suitable value, and efficiently use a power source voltage control system.

To attain the above objects, according to a first aspect of the present invention, there is provided a power source voltage controller comprising a semiconductor circuit having a transfer path and operating by receiving a power source voltage supply; a replica circuit having a power source voltage-delay characteristic approximately equivalent to that of a critical path of the semiconductor circuit, propagating a reference signal, and monitoring a delay time of the critical path of the semiconductor circuit; a phase difference detection circuit for receiving a delay signal from the replica circuit and the reference signal, having a delay time monitor gauge for detecting a phase difference of the delay signal from the reference signal, and outputting the detection result as phase difference information; and a voltage control circuit for generating a power source voltage of a value based on the phase difference information from the phase difference detection circuit and supplying the same to the semiconductor circuit and the replica circuit.

According to a second aspect of the present invention, there is provided a power source voltage controller comprising a semiconductor circuit having a transfer path and operating by receiving a power source supply; a replica circuit having a power source voltage-delay characteristic approximately equivalent to that of a critical path of the semiconductor circuit, propagating a reference signal, and monitoring a delay time of the critical path of the semiconductor circuit; a phase difference detection circuit for receiving a delay signal from the replica circuit and the reference signal, having a delay time monitor gauge for detecting a phase difference of the delay signal from the reference signal, and outputting the detection result as phase difference information; a voltage control circuit for generating a power source voltage of a value based on the phase difference information from the phase difference detection circuit and supplying the same to the semiconductor circuit and the replica circuit; and a delay error correction circuit arranged at either an input side of the reference signal of the replica circuit and an output side of the delay signal and able to correct a delay error with the critical path.

Preferably, it further comprises a pulse generator for generating a pulse, based on a clock of the semiconductor circuit, having a same length as one cycle of the clock for every several cycles and outputting it as the reference signal.

Preferably, the delay time monitor gauge has a delay element chain comprised of a plurality of delay elements connected in series and the phase difference detection circuit indicates the phase difference information by the number of delay elements.

Preferably, the power source voltage control circuit uses the delay element chain of the phase difference detection circuit as a delay margin and controls the delay margin by receiving the phase difference information.

Preferably, the phase difference detection circuit comprises a detecting means for detecting at least one delay time in the delay times corresponding to an excessively low voltage or an excessively high voltage longer or shorter than a predetermined delay time for the clock cycle of the replica circuit.

Preferably, the phase difference detection circuit further comprises a delay gate connected to the delay element chain and the detecting means detects a longer delay time than a predetermined delay time based on an output of the delay gate and detects a shorter delay time than a predetermined delay time based on a signal in a node in the middle of a signal propagation path of the replica circuit.

Preferably, the pulse generator generates at least one of a clock having an advanced phase and a clock having a delayed phase with respect to the clock of the semiconductor circuit and the detecting means detects a shorter time than a predetermined delay time based on the clock having an advanced phase and detects a longer delay time than a predetermined time based on the clock having a delayed phase.

According to a third aspect of the present invention, there is provided a power source voltage controller comprising a semiconductor circuit having a plurality of transfer paths for operating by receiving a power source supply; a plurality of replica circuits having power source voltage-delay characteristics approximately equivalent to that of a critical path of the semiconductor circuit, propagating a reference signal, and monitoring a delay time of the critical path of the semiconductor circuit; a selecting means for selecting as a delay signal an output signal of a replica circuit of the largest delay from outputs of the plurality of replica circuits; a phase difference detection circuit for receiving a delay signal by the selecting means and the reference signal, having a delay time monitor gauge for detecting a phase difference of the delay signal from the reference signal, and outputting the detection result as phase difference information; a voltage control circuit for generating a power source voltage of a value based on the phase difference information from the phase difference detection circuit and supplying the same to the semiconductor circuit and the replica circuits.

According to a fourth aspect of the present invention, there is provided a power source voltage controller comprising a semiconductor circuit having a plurality of transfer paths and operating by receiving a power source supply; a plurality of replica circuits having power source voltage-delay characteristics approximately equivalent to that of a critical path of the semiconductor circuit, propagating a reference signal, and monitoring a delay time of the critical path of the semiconductor circuit; a selecting means for selecting as a delay signal an output signal of a replica circuit of the largest delay from outputs of the plurality of replica circuits; a phase difference detection circuit for receiving a delay signal by the selecting means and the reference signal, having a delay time monitor gauge for detecting a phase difference of the delay signal from the reference signal, and outputting the detection result as phase difference information; a voltage control circuit for generating a power source voltage of a value based on the phase difference information from the phase difference detection circuit and supplying the same to the semiconductor circuit and the replica circuits; and a delay error correction circuit arranged at either an input side of the reference signal of the replica circuit and an output side of the delay signal and able correct a delay error with the critical path.

According to a fifth aspect of the present invention, there is provided a power source voltage controller comprising a semiconductor circuit having a transfer path and operating at a plurality of different frequencies by receiving a power source supply; a plurality of replica circuits having power source voltage-delay characteristics approximately equivalent to the critical paths for every operating frequency of the semiconductor circuit, propagating the reference signal, and monitoring the delay time of a critical path of the semiconductor circuit; a detection portion for receiving the delay signals by the replica circuits and the reference signals and detecting a circuit having the largest delay time ratio to a clock cycle among the replica circuits of the frequencies; and a voltage control circuit for generating a power source voltage of a value based on the detection results of the detection portion and supplying it to the semiconductor circuit and the replica circuits.

According to a sixth aspect of the present invention, there is provided a power source voltage controller comprising a semiconductor circuit having a transfer path and operating at a plurality of different frequencies by receiving a power source supply; a plurality of replica circuits having power source voltage-delay characteristics approximately equivalent to the critical paths for every operating frequency of the semiconductor circuit, propagating the reference signal, and monitoring the delay time of a critical path of the semiconductor circuit; a detection portion for receiving the delay signals by the replica circuits and the reference signals and detecting a circuit having the largest delay time ratio to a clock cycle among the replica circuits of the frequencies; a voltage control circuit for generating a power source voltage of a value based on the detection results of the detection portion and supplying it to the semiconductor circuit and the replica circuits; and a plurality of delay error correction circuits arranged on either an input side of the reference signal of the replica circuits or an output side of the delay signals and able to correct the delay error with the critical path.

Preferably, the detection portion comprises a plurality of phase difference detection circuits corresponding to the frequency systems for receiving the delay signals by the replica circuits and the reference signal, having delay time monitor gauges for detecting a phase difference of the delay signals with respect to the reference signal, and outputting the detection results as phase difference information and a selecting means for selecting a circuit having the largest delay ratio with respect to the clock cycles from the plurality of replica circuits based on the outputs of the plurality of phase difference detection circuits.

Preferably, a delay time adjustment step width of the monitor gauge in the frequency systems is composed of step widths corresponding to the ratio of the frequencies.

That is, according to the present invention, a pulse signal having same length as one cycle of a clock is generated for every several cycles based on the clock of a semiconductor circuit (LSI), for example, in a pulse generation circuit and is supplied as a reference signal directly to a replica circuit or via a delay error correction circuit and to a phase difference detection circuit.

The reference signal transferred through the replica circuit and/or delay error correction circuit has a delay in accordance with the value of the power source voltage being supplied, receives a delay effect, and is output as a delay signal to the phase difference comparison circuit.

The phase difference detection circuit receives the delay signal and the reference signal from the replica circuit, detects a phase difference of the delay signal with respect to the reference signal by using a delay time monitor gauge, and outputs the detected results as phase difference information to the voltage control circuit.

The voltage control circuit generates a power source voltage of a value based on the phase difference information by the phase difference detection circuit and supplies it to the semiconductor circuit and the replica circuit.

Also, according to the present invention, in a configuration having a number of replica circuits corresponding to a plurality of critical paths, the output signal of the replica circuit having the larger delay is selected from the outputs of the plurality of replica circuits by a selection means and is supplied to the phase difference detection circuit.

Also, according to the present invention, in a plurality of semiconductor circuits operating at different clock frequencies, a delay element chain type phase difference detection circuit is configured in a delay time adjusting step in accordance with, for example, the ratio of the frequencies. As a result, the phase difference between different frequencies can be compared regardless of the frequencies.

BRIEF DESCRIPTION OF THE DRAWINGS

These and other objects and features of the present invention will become clearer from the following description of the preferred embodiments given with reference to the accompanying drawings, in which.

DESCRIPTION OF THE PREFERRED EMBODIMENTS

Below, preferred embodiments will be described with reference to the accompanying drawings.

Figure 1:
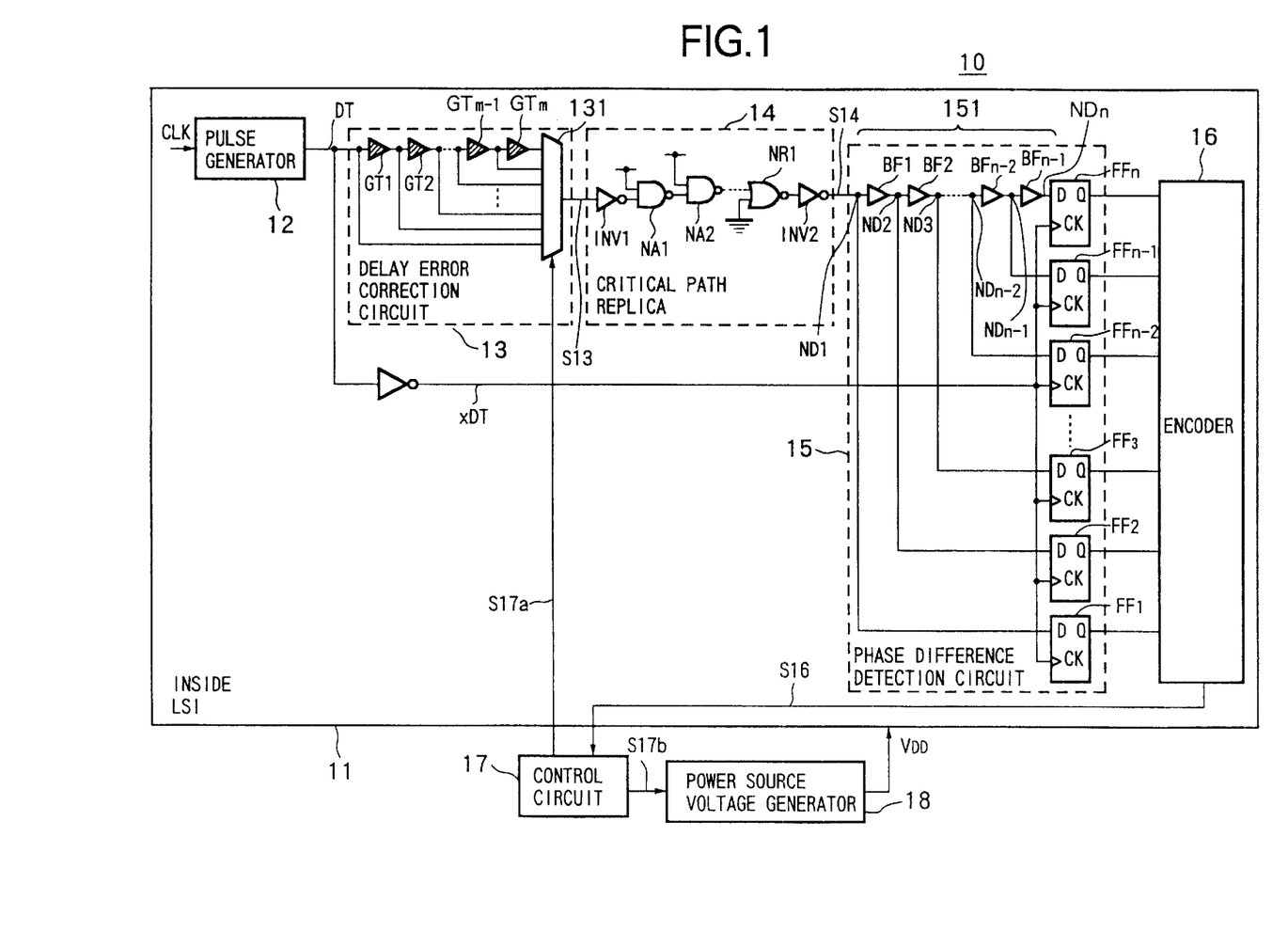
FIG. 1 is a circuit diagram of a first embodiment of a power source voltage controller using a replica circuit according to the present invention.
Figure 2A:
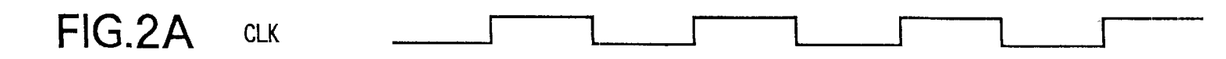
FIG. 2 consisting of FIG. 2A through 2O is a timing chart of an operation waveform of the phase difference detection circuit in FIG. 1.
Figure 2B:
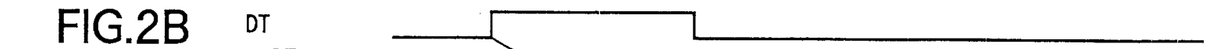
Figures 2C, 2D, 2E:
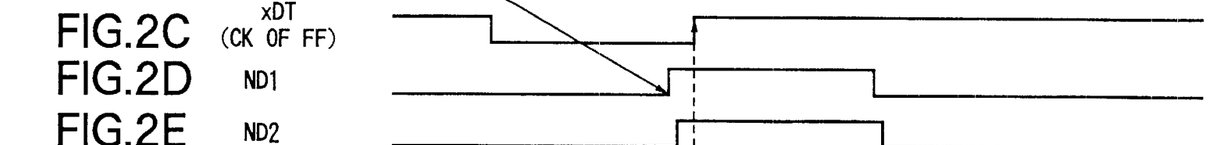
Figures 2F, 2G:
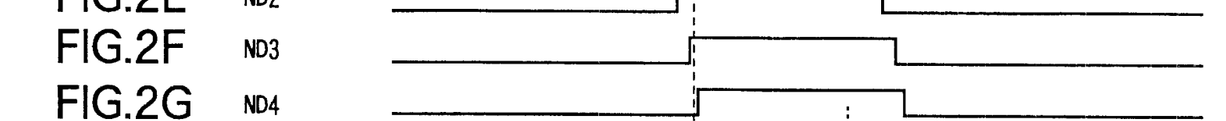
Figure 2H:
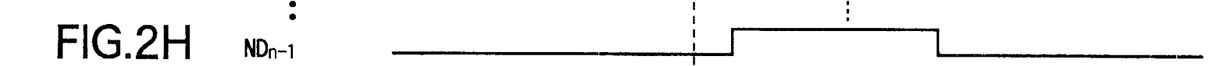
Figures 2I, 2J:
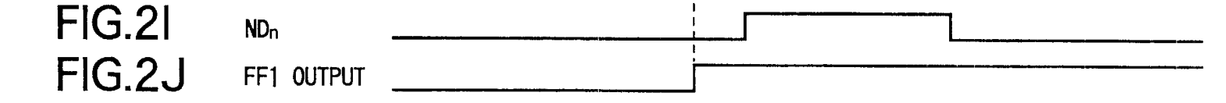
Figures 2K, 2L:
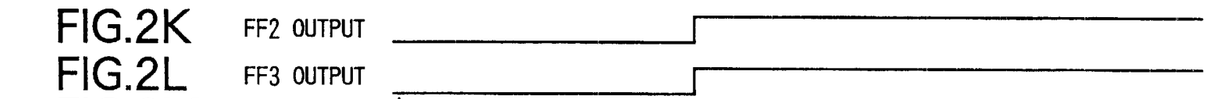
Figure 2M:
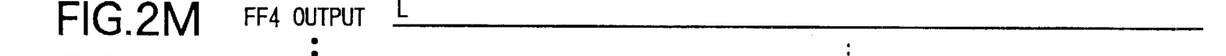
Figures 2N, 2O:
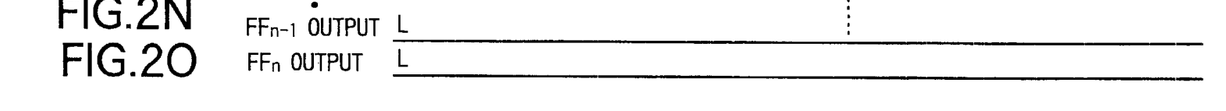

FIG. 1 is a block diagram of a first embodiment of a power source voltage controller using a replica circuit according to the present invention.

A power source voltage controller 10 comprises a semiconductor circuit (LSI) 11 to which a controlled power source voltage VID is supplied, a pulse generator 12, a delay error correction circuit 13, a critical path replica circuit 14, a delay element chain type phase difference detection circuit 15, an encoder 16, a control circuit 17, and a power source voltage generation circuit 18.

The pulse generator 12, delay error correction circuit 13, critical path replica circuit 14, phase difference detection circuit 15, and encoder 16 are integrally formed in the semiconductor circuit (LSI) 11.

The control circuit 17 and power source generation circuit 18 comprise a voltage control circuit.

The semiconductor circuit 11 is supplied with a power source voltage $V_{DD}$ from the power source voltage generator 18 and has a not shown plurality of transfer paths.

Each of the transfer paths is, for example, provided with a gate element. Each gate element is configured by, for example, an insulated gate type field effect transistor, that is, a metal insulator semiconductor (MIS) type circuit.

The pulse generator 12 receives, for example, a system clock CLK of the semiconductor circuit 11 and generates a pulse signal DT as a reference signal having the same length with one cycle of a clock every several cycles based on the clock CLK.

Below, the reason why a pulse is generated once every several clock cycles will be explained.

In the critical path replica circuit 14, the delay time varies by a large extent in accordance with the power source voltage $V_{DD}$.

When the power source voltage $V_{DD}$ is low and the delay time of the critical path replica circuit 14 is very large, the phase difference detection circuit 15 is liable to detect a phase difference with an edge of a clock delayed by two cycles or more and the power source voltage $V_{DD}$ is controlled to match in phase at the delay time.

To prevent the above, the pulse generation cycle of the pulse generator 12 is set in order that the phase difference be detected after a sufficiently longer period of time than the delay time of the critical path replica circuit 14 when the power source voltage $V_{DD}$ is low.

A delay error correction circuit 13 is a circuit for correcting a delay error between the critical path and the critical path replica circuit 14 and corrects a delay error of the replica circuit 14 and adjusts the so-called zero point of a margin.

The delay error correction circuit 13 is provided for the reasons below.

Namely, it is extremely difficult for the critical path replica circuit to reproduce the exact same delay characteristic as an actual critical path up to the effect due to layout and interconnections.

Therefore, there is the possibility that the produced replica circuit has a too short a delay time compared with the actual critical path and that the voltage-delay characteristic will deviate.

A certain degree of errors can be handled by a margin setting delay element (gate) chain provided in the phase difference detection circuit 15, however, since the gate chain is also used for detection of the phase difference as will be explained later, the dynamic range of the phase difference detection becomes narrower if the gate chain is used for the error correction of the replica circuit.

Thus, a delay error correction circuit 13 is provided for correcting delay error of the replica circuit and adjusting the zero point of a margin.

The delay error correction circuit 13 is comprised by, for example, a plurality of gates GT1 to GTm connected in series and a selector 131.

The selector 131 connects in parallel the output terminals of the gates GT1 to GTm and an input terminal of the gate GT1 to which an output signal DT of the pulse generator 12 is input, selects an output signal of a gate having a different delay or an original signal DT by a correction signal S17a of the control circuit 17, and outputs it to the replica circuit 14 as a signal S13.

As explained above, the delay error correction circuit 13, can change the delay by the correction signal S17a of a control signal 17.

Joint use of the delay error correction circuit 13 and the gate chain type phase difference detection circuit 15 enables a wide dynamic range to be secured in the detection of the phase difference and tuning of the delay time of the replica circuit.

The replica circuit 14 is in a semiconductor circuit 11 and configured as a circuit having an equivalent power source voltage-delay characteristic as the path configuration selected as a critical path, operates by being supplied with the power source voltage $V_{DD}$ by the power source voltage generation circuit 18, receives as an input an output signal S13 of the delay error correction circuit 13, propagates it by performing gate processing etc., and outputs it as a delay signal S14 to the phase difference detection circuit 15.

The replica circuit 14 is, for example as surrounded by a dotted line in FIG. 1, configured as an equivalent circuit to a transfer path in the semiconductor circuit 11 including inverters INV1 and INV2, NAND gates NA1 and NA2, and NOR gate NR1. An input terminal of the inverter INV1 received as input the output signal S13 of the delay error difference correction circuit 13.

The delay element chain type phase difference detection circuit 15 detects a phase difference between a signal xDT obtained by inverting the pulse signal DT serving as a reference signal in the inverter INV11 and an output delay signal S14 of the replica circuit 142, generates an n-bit signal in accordance with the detected results, and outputs it to the encoder 16.

In other words, the phase difference detection circuit 15 compares the delay time between the clock cycle and the critical path replica circuit 14 and sets a delay margin of the critical path replica circuit 14.

The phase difference detection circuit 15 comprises, for example, a delay element chain 151 for serving as a gauge for a delay time monitor and n-number of D-type flip-flops FF1 to FFn.

The delay element chain 151 comprises a gate chain consisting of a plurality (n–1 in the present embodiment) of buffers BF1 to BFn–1 comprised of two-stage inverters connected in series.

Note that, the configuration of the delay element chain is not limited to the gate chain, and the gate configuring the gate chain is not limited to a buffer comprised of two-stage inverters.

The output nodes ND2 to NDn of the buffers BF1 to BFn–1 comprising the delay element chain 151 are connected to input terminals D of the flip-flops FF2 and FFn, while the input node ND1 of the first buffer BF1 is connected to the input terminal D of the flip-flop FF1.

CK terminals of the flip-flops FF1 to FFn are supplied in parallel with an inverted signal xDT of the pulse signal DT generated in the pulse generator 12.

In the flip-flops FF1 to FFn, it is detected up to which gate the signal has reached in a period of one clock cycle after inputting data to the critical path replica circuit 14.

FIG. 2 is a timing chart of an operation waveform of the phase difference detection circuit 15 showing the relationship of signals output from the buffers (gates) of the phase difference detection circuit 15 and an inverted signal xDT of the pulse signal DT of the flip-flops FF1 to FFn to the CK pulse.

In this example, the node ND1 to node ND3 become a high level (H) prior to a rising edge (CK signal of flip-flop FF) of the signal xDT, while the node ND4 on become a high level after the signal xDT.

Accordingly, the outputs of the flip-flops FF1 to FF3 are a high level, and the outputs of the flip-flop FF4 on are a low level (L).

Namely, outputs of the flip-flops FF1 to FFn become a high level when the delay of the clock signal DT is within one cycle.

From the above results, the delay time of the critical path replica circuit 14 and up to the third element of the delay element chain is equal to one cycle of the clock.

The encoder 16 converts the detected results of the phase difference of the outputs of the flip-flops FF1 to FFn to binary data and outputs it as a phase difference information signal S16 to the control circuit 17.

The control circuit 17 is set with the optimal number of gates of replica margins, determines an amount of change of the power source voltage by comparing the set value with the number of gates indicated by the phase difference information signal S16 sent from the encoder 16, and outputs a signal S17b corresponding to the power source voltage desired to be changed to the power source voltage generation circuit 18. Also, the control circuit 17 outputs a correction signal S17a to the delay error correction circuit 13 and performs processing for making the amount of change of the power source voltage larger when the difference with the number of gates set in the control circuit 17 is large and making the amount of change smaller when the difference is small.

Note that by using a processor as a control circuit 17, the optimal number of gate stages for the replica margin and the amount of change of the power source voltage corresponding to the phase difference can all be set by a program of the processor.

The power source voltage circuit 18 generates a power source voltage $V_{DD}$ in accordance with the output signal S17b of the control circuit 17 and supplies it to the semiconductor circuit 11 including the replica circuit 14.

Note that when configuring the power source voltage generation circuit 18 with a DC-DC converter, it becomes possible to set a replica margin etc. by a program.

The operation of the above configuration will be explained next.

In the pulse generation circuit 12, a pulse signal DT having the same length as one cycle of a clock is generated every several cycles based on the clock of the semiconductor circuit (LSI), is supplied to the delay error correction circuit 13, inverted in the inverter INV11, and supplied to the delay element chain type phase difference detection circuit 15.

In the delay error correction circuit 13, an output signal of a different delay or the original pulse signal 20 DT is selected by a correction signal S17a of the control circuit 17 and output as a signal S13 to the replica circuit 14.

The replica circuit 14 operates by receiving a power source voltage $V_{DD}$ by the power source generation circuit 18. The output signal S13 of the delay error correction circuit 13 input is subjected to gate processing etc., propagated, and output as a delay signal S14 to the phase difference detection circuit 15.

The delay signal S14 supplied to the phase difference detection circuit 15 is input to a delay element chain 151 serving as a delay time monitor gauge.

Then, signals appearing at the output nodes ND2 to NDn of the buffers BF1 to BFn–1 comprising the delay element chain 151 are supplied to input terminals D of corresponding flip-flops FF2 to FFn. The supplied delay signal S14 of the input node ND1 of the first buffer BF1 is supplied to the input terminal D of the flip-flop FF1.

CK terminals of the flip-flops FF1 to FFn are supplied in parallel with an inverted signal xDT of the detection clock signal DT generated in the pulse generation circuit.

As a result, in the flip-flop FF1 to FFn, it is detected up to which gate the signal has reached in a period of one clock cycle after inputting data to the critical path replica circuit 14.

Namely, the delay element chain type phase detection circuit 15 detects the phase difference of the signal xDT obtained by inverting the pulse signal DT serving as a reference signal in the inverter INV11 and the output delay signal S14 of the replica circuit 14. In other words, the delay time of a clock cycle and that of the critical path replica circuit 14 are compared, and an n-bit signal in accordance with the result is generated and output to the encoder 16.

In the encoder 16, the detection result of the phase difference given by the output signals of the flip-flops FF1 to FFn is output to the control circuit 17 as a phase difference information signal S16 which indicates the number of delay elements (gate) converted to binary data.

The control circuit 17 has been set the most suitable number of gates of the replica margin, compares the set value and the number of gates indicated by the phase difference information signal S16 sent from the encoder 16, and determines an amount of change of the power source voltage.

Specifically, when the difference with the number of gates set in the control circuit 17 is large, processing is performed for making the amount of change of the power source voltage larger, while when the difference is small, processing is performed for making the amount of change smaller.

Along with this, a signal S17b corresponding to the power source voltage desired to be changed is output to the power source generation circuit 18.

The power source voltage generation circuit 18 generates a power source voltage $V_{DD}$ in accordance with the output signal S17b of the control circuit 17 and supplies it to the semiconductor circuit 11 including the replica circuit 14.

The delay error correction circuit 13 selects an output signal of a different delay or the original pulse signal DT by the correction signal S17a of the control circuit 17 and corrects the delay error of the critical path and the critical path replica circuit 14. Namely, delay error of the replica circuit 14 is corrected and the zero-point of the margin is adjusted.

As explained above, according to the first embodiment, by comparing the delay time of the replica circuit 14 of a critical path and that of one clock cycle in the phase difference detection circuit 15 using the delay element chain 151, it becomes possible to detect as little as the phase difference corresponding to one delay element's worth of delay time, that is, a gate's worth of delay time steps.

Also, since the delay element chain 151 used in the phase difference detection circuit 15 can be used in common for a delay element chain for margin setting of the critical path replica circuit 14, the layout area can be reduced.

Furthermore, since it is possible to perform processing of making the amount of change of the power source voltage larger when the difference with the number of gates set in the control circuit 17 is larger, while making the amount of change smaller when the difference is small, the time until the power source voltage $V_{DD}$ converges to the optimal time can be greatly reduced and the amount of change of the power source voltage after convergence can be kept small.

Also, since it is possible to correct the optimal number of delay elements, that is, the optimal replica margin, and replica delay error by a program of the processor, it is possible to find the optimal value through a test after producing an LSI and to flexibly change the set value.

Also, by making joint use of the delay element chain type phase difference detection circuit 15 and the replica delay error correction circuit 13, there is the advantage that a wide dynamic range can be secured for the phase difference detection circuit 15 and the delay time of the replica circuit can be tuned.

Note that, in the first embodiment, the phase difference detection results are converted to binary data by the encoder, but needless to say bit series of the phase difference detection results may be used as they are. The invention is not limited to these examples of the configuration.

Also, the first embodiment was configured to input an output of the pulse generator 12 to the delay error correction circuit 13 prior to inputting the same to the critical path replica circuit 14, however, needless to say it is also possible to input the output of the pulse generator 12 to the critical path replica circuit 14 prior to inputting the same to the delay error correction circuit 13 and to input the output to the delay element chain.

Second Embodiment

Figure 3:
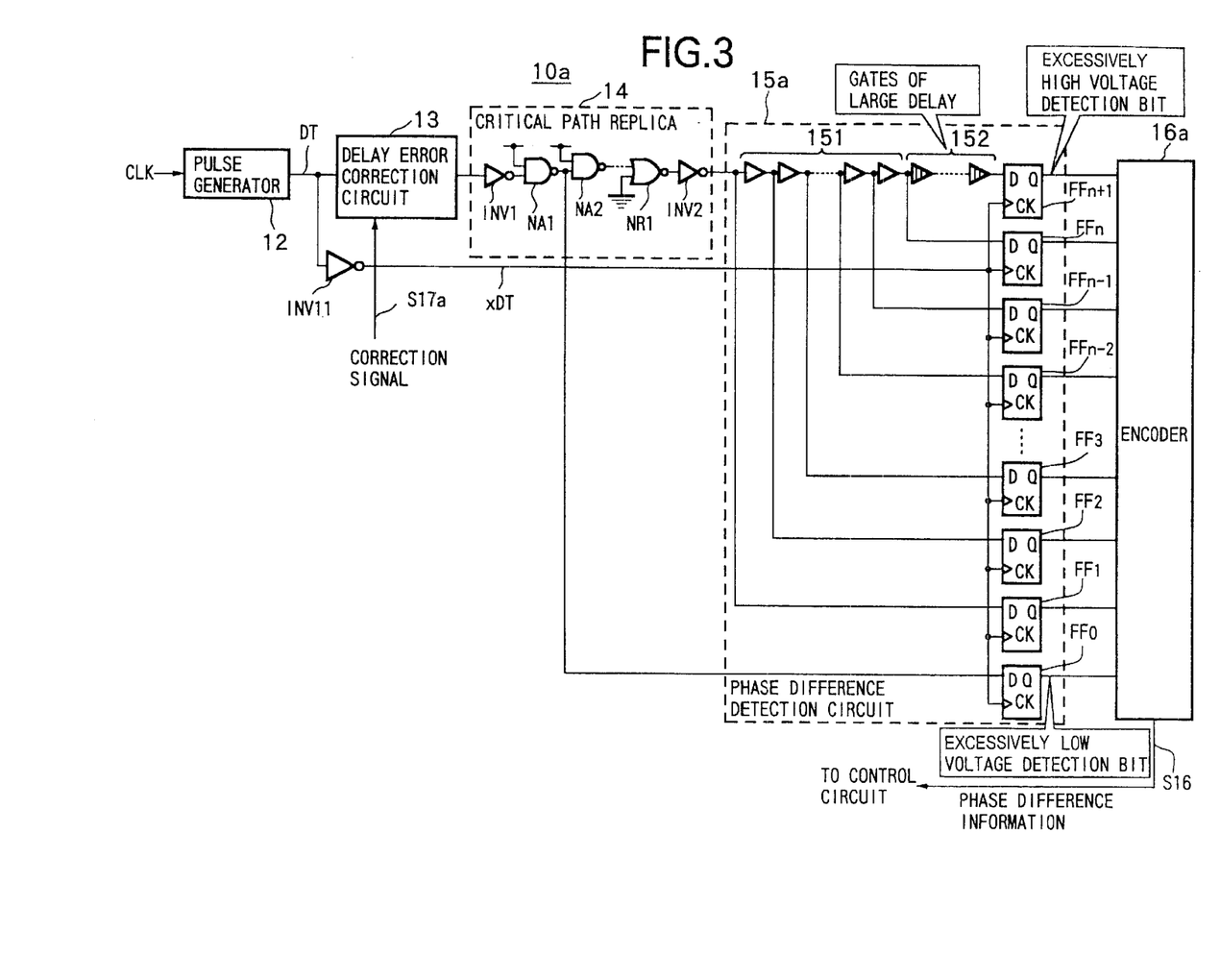
FIG. 3 is a circuit diagram of a second embodiment of a power source voltage controller using a replica circuit according to the present invention.

FIG. 3 is a block diagram of a second embodiment of a power source voltage controller using a replica circuit according to the present invention.

Note that the control circuit and power source voltage generation circuit shown in FIG. 1 are omitted in FIG. 3. Also, the delay error correction circuit is the same as the circuit in FIG. 1, so the detailed circuit configuration is omitted here.

The second embodiment differ from the above first embodiment in the point of the configuration of the delay element chain type phase different detection circuit.

Specifically, it is configured so that when the delay time of the critical path replica circuit serving as the detecting means is very large or small, a gate 152 of a large delay is added to the gate chain to detect it, a flip-flop FFn+1 for an excessively large voltage detection bit and a flip-flop FF0 for an excessively small voltage detection bit are provided, and a signal is taken out from a node in the middle of the replica circuit 14 (an output node of the NAND gate NA1 in this example).

An output node of the gate 152 is connected to the input terminal D of the flip-flop FFn+1 for an excessively large voltage detection bit, while a node of the NAND gate NA1 in the middle of the replica circuit 14 is connected to the input terminal D of the flip-flop FF0 for an excessively small voltage detection bit.

According to this configuration, detection when a power source voltage $V_{DD}$ (for example IV) is extremely high (for example 1.5V) becomes possible by the gate 151 with a large delay, while detection when the power source voltage $V_{DD}$ is extremely low (for example 0.5V) becomes possible by a node signal in the middle of the replica circuit.

According to the second embodiment, since processing for making the amount of change of the power source voltage larger based on the detection bit value becomes possible, the converging time can be further shortened.

The rest of the configuration and operation and effects are the same as in the above first embodiment.

Third Embodiment

Figure 4:
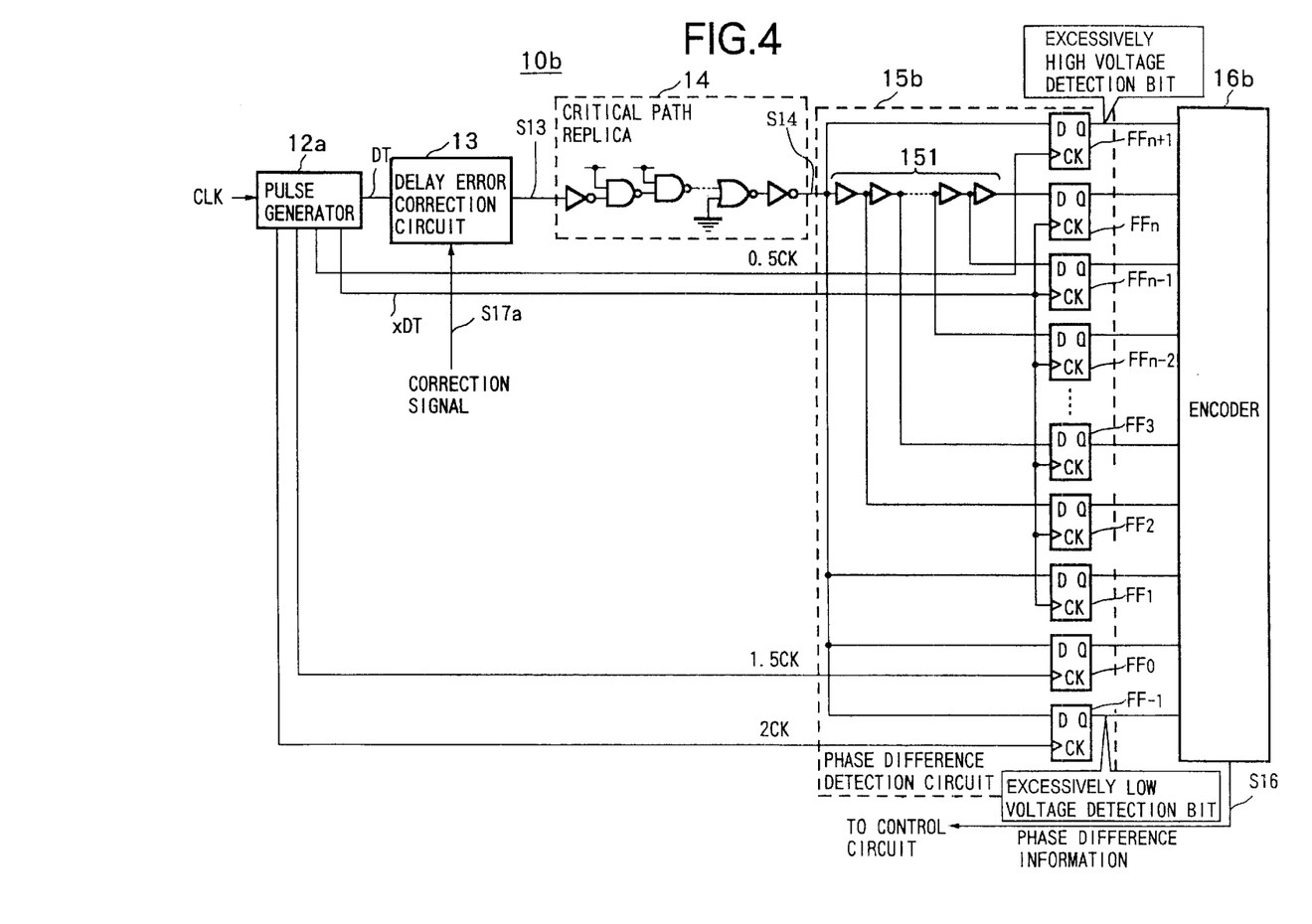
FIG. 4 is a circuit diagram of a third embodiment of a power source voltage controller using a replica circuit according to the present invention.

FIG. 4 is a block diagram of a third embodiment of a power source voltage apparatus using a replica circuit according to the present invention.

Note that, in FIG. 4, the control circuit and the power source voltage generation circuit shown in FIG. 1 are omitted in the same way as in FIG. 3. Also, the delay error correction circuit is the same as in the circuit in FIG. 1, so a detailed explanation of the circuit configuration therefor will be omitted here.

The third embodiment differs from the above second embodiment in the point that to detect the case where the power source voltage $V_{DD}$ is extremely high or extremely low, instead of providing a gate 152 of a large delay as a detecting means to the gate chain of the delay element chain type phase difference detection circuit 15b or taking out a signal from a node in the middle of the replica circuit 14, a flip-flop FFn+1 for an excessively large voltage detection bit and flip-flops FF0 and FF−1 for an excessively small voltage detection bit are provided in the phase error detection circuit 15, a detection clock deviated in phase with respect to a detection clock CK in the pulse generator 12a is generated, and the detection clocks are supplied to the phase difference detection circuit 15b.

Specifically, the pulse generator 12a generates a clock 0.5CK having a phase advanced ½ cycle and a clock 1.5CK having a phase delayed 1.5CK and a clock 2CK having a phase delayed 1 cycle with respect to the detection clock CK.

Then, the clock 0.5CK is supplied to a CK terminal of the flip-flop FFn+1 for an excessively large voltage detection bit of the phase difference detection circuit 15b, the clock 1.5CK is supplied to a CK terminal of the flip-flop FF0 for an excessively small voltage detection bit, and the clock 2CK is supplied to a CK terminal of the flip-flop FF−1 for an excessively small voltage detection bit.

Furthermore, input terminals D of the flip-flop FFn+1 for an excessively large voltage detection bit and the flip-flops FF0 and FF−1 for excessively small voltage detection bits are commonly connected to a node ND1 corresponding to an input node of a delay signal S14.

Figure 5:
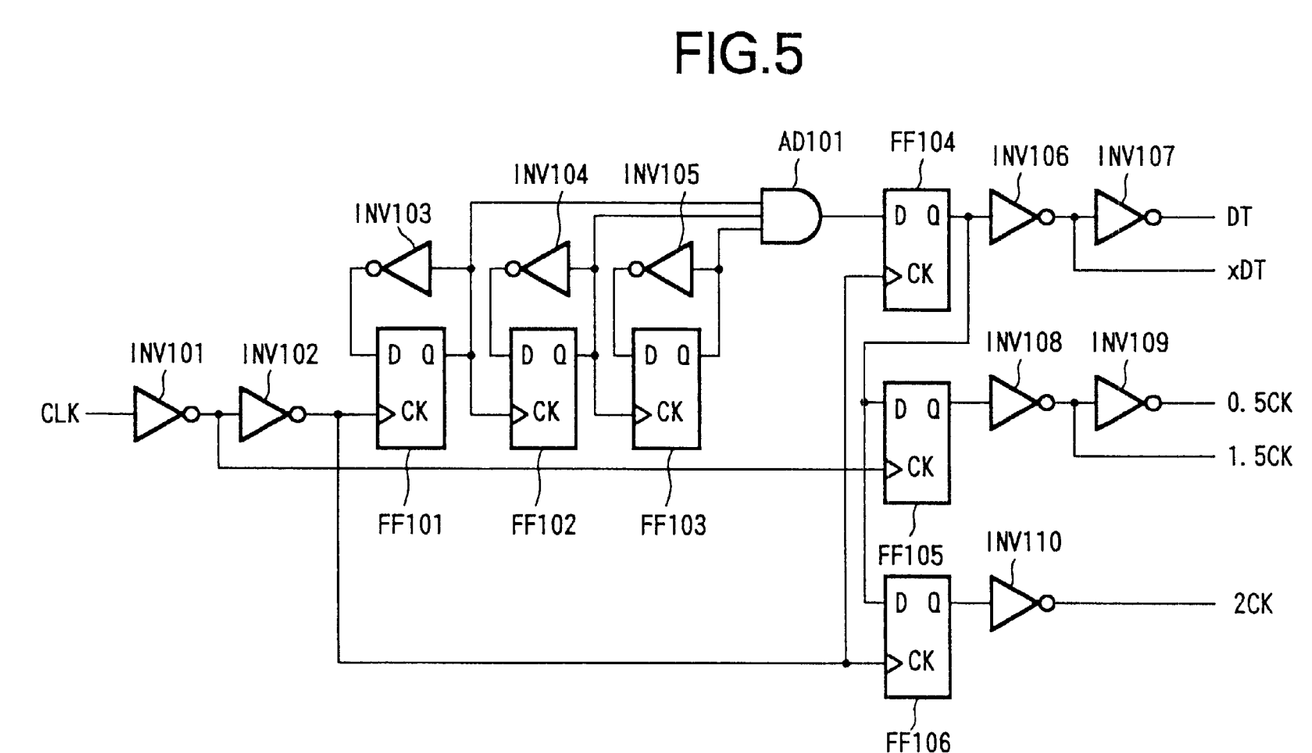
FIG. 5 is a circuit diagram of an example of the configuration of a pulse generation circuit according to the third embodiment.
Figure 6A:
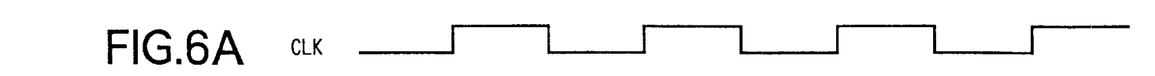
FIG. 6 consisting of FIG. 6A through 6H is a timing chart of an operation waveform of a phase difference detection circuit according to the third embodiment.
Figures 6B, 6C, 6D:
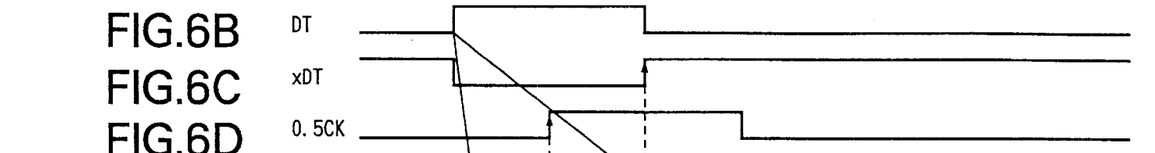
Figures 6E, 6F:
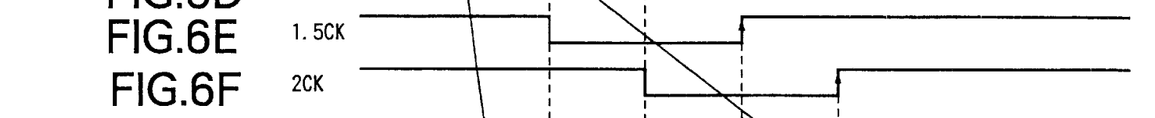
Figure 6G:
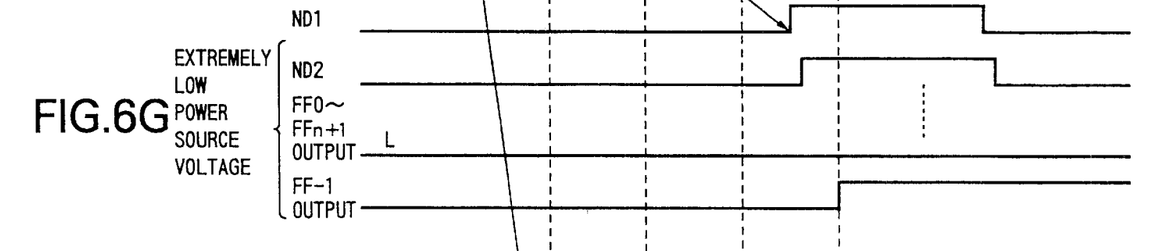
Figure 6H:
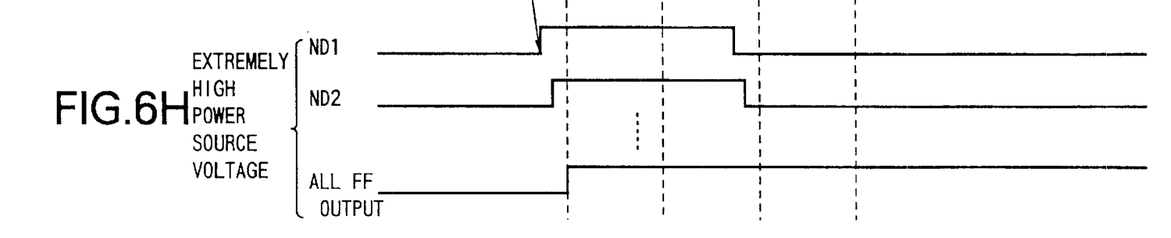

FIG. 5 is a circuit diagram of an example of the specific configuration of the pulse generator.

The pulse generator comprises, as shown in FIG. 5, flip-flops FF101 to FF106, inverters INV101 to INV110, and a three-input AND gate AD101.

In FIG. 5, the inverters INV101 and INV102, INV106 and INV107, and INV108 and INV109 are connected in series.

A clock CLK is supplied to an input terminal of the inverter INV101, while an output terminal of the inverter INV101 is connected to a CK terminal of the flip-flop FF105.

An output terminal of the inverter INV102 is connected to CK terminals of the flip-flops FF101, FF104, and FF106.

An output terminal Q of the flip-flop FF101 is connected to the CK terminal of the flip-flop FF102, a first input terminal of an AND gate AD101, and its own input terminal D via the inverter INV103.

An output terminal Q of the flip-flop FF102 is connected to the CK terminal of the flip-flop FF103, a second input terminal of the AND gate AD101, and its own input terminal D via the inverter INV104.

An output terminal Q of the flip-flop FF103 is connected to a third terminal of the AND gate AD101, and its own input terminal D via the inverter INV105.

Also, an output terminal of the AND gate AD101 is connected to the input terminal D of the flip-flop FF104, while an output terminal Q of the flip-flop FF104 is connected to the input terminals D of the flip-flops FF105 and FF106.

An output terminal Q of the flip-flop FF104 is connected to an input terminal of the inverter INV106, an output terminal Q of the flip-flop FF105 is connected to an input terminal of the inverter INV108, and an output terminal Q of the flip-flop FF106 is connected to an input terminal of the inverter INV110.

Then, a clock signal DT is output from the output terminal of the inverter INV107, a clock signal xDT is output from the output terminal of the inverter INV106, a clock signal 0.5CK is output from the output terminal of the inverter INV109, a clock signal 1.5CK is output from the output terminal of inverter INV108, and a clock signal 2CK is output from the output terminal of the inverter INV110.

In this circuit, one pulse is generated for every eight cycles.

FIG. 6 is a timing chart for explaining the operation of the circuit in FIG. 4.

As shown in FIG. 6, in the circuit of FIG. 4, since a signal of a high level is output from the flip-flop FFn+1 being supplied with the clock 0.5CK having a phase advanced ½ cycle with respect to the detection clock signal CK (DT) when the power source voltage $V_{DD}$ is extremely high, outputs of all of the flip-flops FF−1 to FFn become a high level.

On the other hand, when the power source voltage $V_{DD}$ is extremely low, an output signal of the flip-flop FF0 being supplied with the clock 1.5CK having a phase delayed ½ cycle with respect to the detection clock CK becomes a low level, and only an output signal of the flip-flop FF−1 being supplied with the clock 2CK having a phase delayed 1 cycle with respect to the detection clock CK becomes a high level.

When the power source voltage $V_{DD}$ is further lower, the output signal of the flip-flop FF−1 being supplied with the clock 2CK having a phase delayed 1 cycle with respect to the detection clock CK is made a low level.

According to the third embodiment, since processing for making the amount of change of a power source voltage larger based on the detected bit values becomes possible, the convergence time can be further shortened.

The rest of the configuration and the operation and effects are as same as those in the above first embodiment.

Note that, in the third embodiment, clocks of a phase delayed up to one cycle are used, however, by using clocks of a further delayed phase, that is, a clock of a phase delayed by two cycles, a clock of a phase delayed by three cycles, etc., it becomes possible to realize a wider detection range.

Fourth Embodiment

Figure 7:
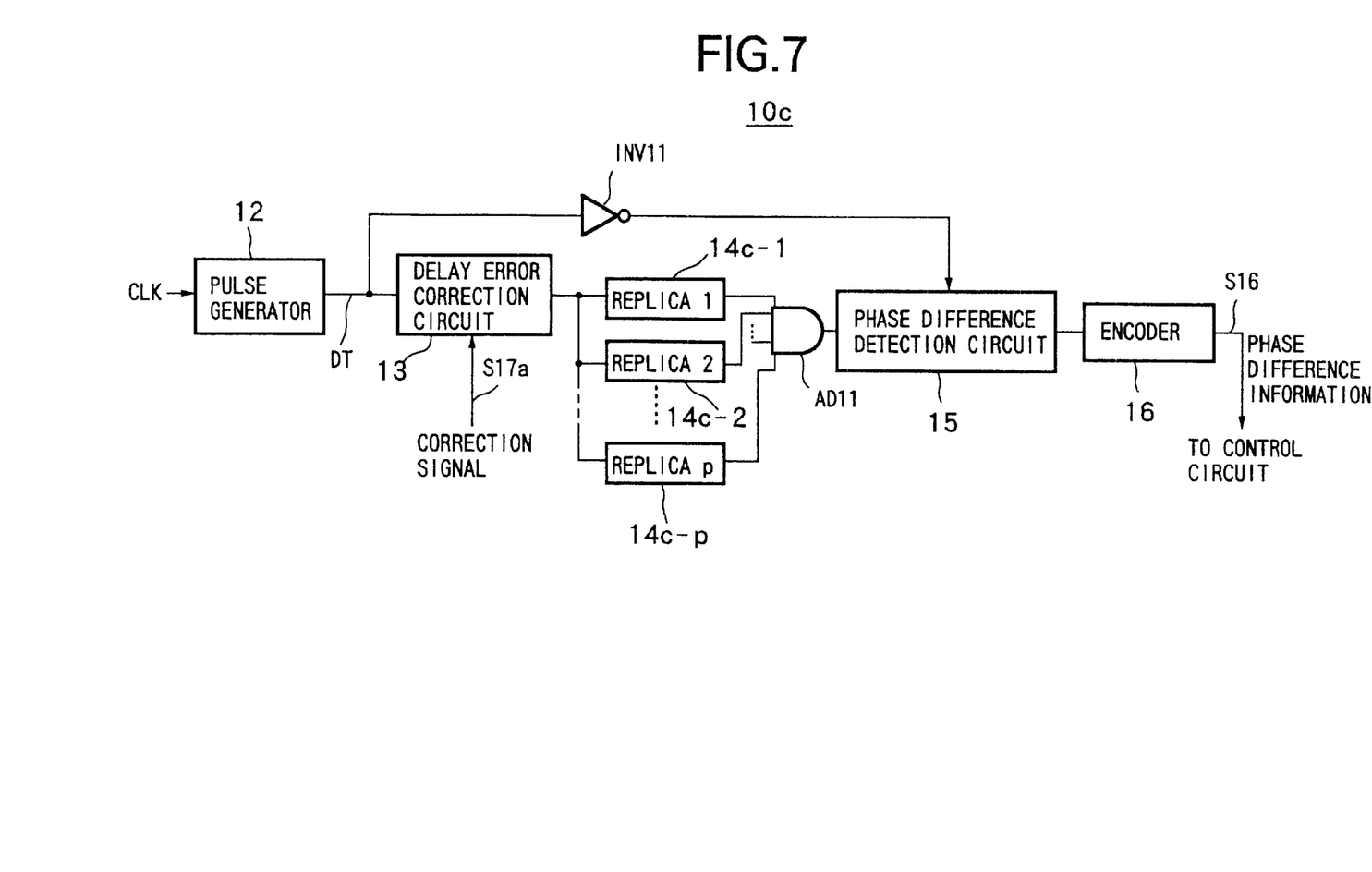
FIG. 7 is a circuit diagram of a fourth embodiment of a power source voltage controller using a replica circuit according to the present invention.

FIG. 7 is a block diagram of a fourth embodiment of a power source voltage using a replica circuit according to the present invention.

The fourth embodiment differs from the above first embodiment in the point that a plurality (for example, p number) of paths which can be a critical path are used as replica circuits and connected in parallel with respect to the output of the delay error correction circuit, outputs of the p number of replica circuits 14c-1 to 14c-p are ANDed in a p-input AND gate AD11 serving as a selecting means, and the phase difference with the one of the larger delay is detected in the phase difference detection circuit 15.

Also, in the fourth embodiment, a replica circuit of a critical path including, for example, a so-called RC delay based on the interconnection resistance R and interconnection capacity C is adopted as well.

The reason for use of a plurality of replica circuits in this way is as below.

There is a possibility that the critical paths of an LSI will be changed in accordance with changes of the operating voltage and processing content. In the case where a path not being used as a replica circuit becomes a critical path, the LSI is liable to be unable to operate correctly.

There is a method of using a replica margin as a countermeasure for the problem, however, there is a high possibility of the margin becoming excessive, thus it is not a preferable method.

Accordingly, the fourth embodiment is configured to use a plurality of paths connected in parallel for the replica circuits.

In such a configuration, the outputs of a plurality of replica circuits 14c-1 to 14c-p having different characteristics are ANDed in the AND gate AD11, and the results are input to the phase difference detection circuit 15.

At this time, a rising edge of an input signal to the phase difference detection circuit 15 becomes equal to a rising edge of the path having the largest delay among all of the replica circuits 14c-1 to 14c-p, thus the phase difference is always detected in the worst delayed path by using the timing of the edge.

According to the fourth embodiment, since the phase difference is detected by using replica circuits having a plurality of critical paths of different characteristics, it can handle the change of a critical path due to a change in the power source voltage and processing content and further can guarantee more reliable operation of the LSI.

Fifth Embodiment

Figure 8:
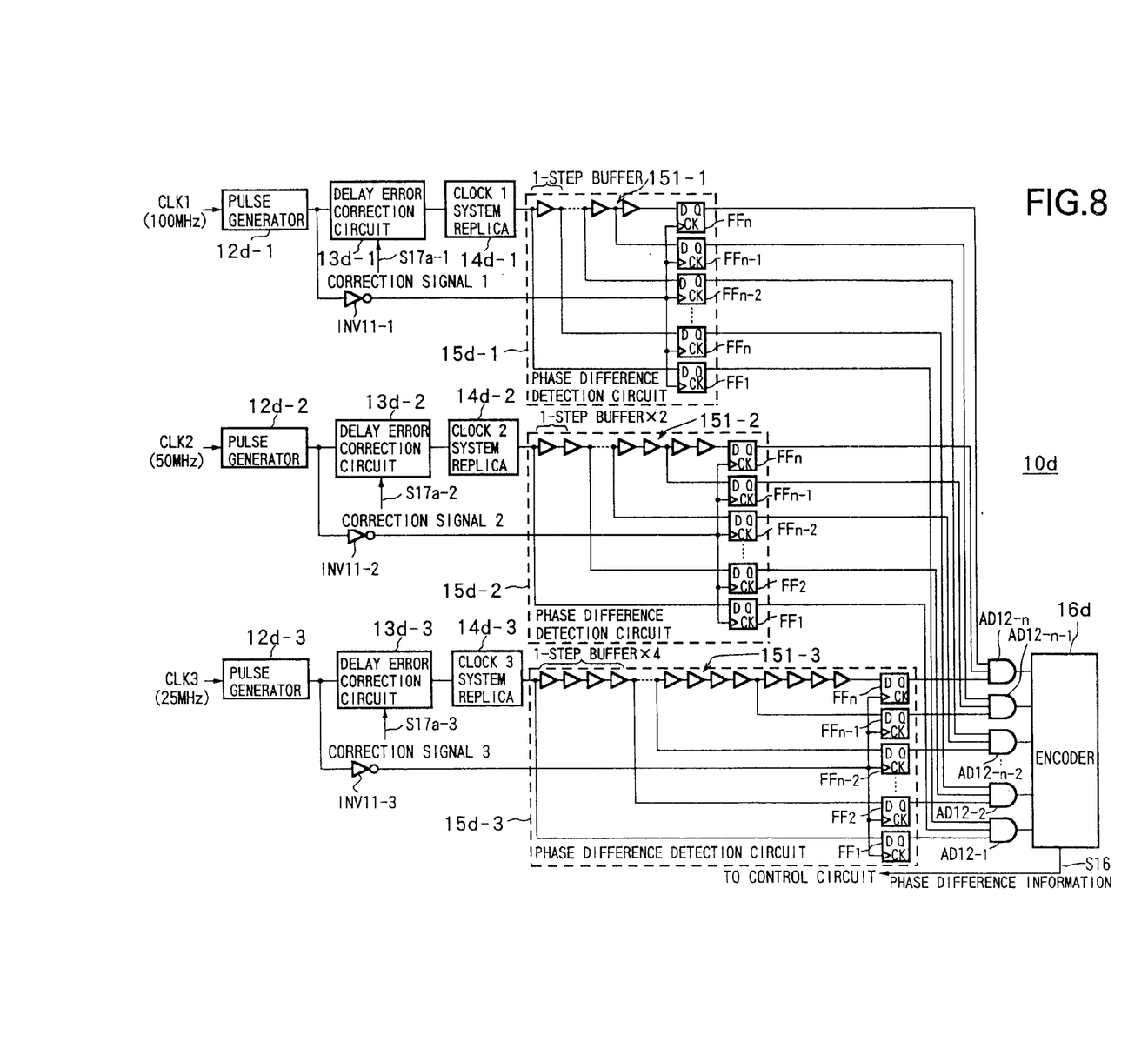
FIG. 8 is a circuit diagram of a fifth embodiment of a power source voltage controller using a replica circuit according to the present invention.

FIG. 8 is a block diagram of a fifth embodiment of a power source voltage controller using a replica circuit according to the present invention.

In the fifth embodiment, an LSI which operates by a plurality of different frequencies is provided with a delay element chain type phase difference detection circuit configured by a delay time adjustment step in accordance with the ratio of the frequencies and compares the phase difference between two different frequencies regardless of the frequencies.

The comparison of the delay between the paths of different frequencies has to be performed by the ratio of the delay of the path with respect to the clock cycle.

In the fifth embodiment, provision is made of delay error correction circuits 13d-1, 13d-2, and 13d-3, critical path replica circuits 14d-1, 14d-2, and 14d-3, and phase difference detection circuits 15d-1, 15d-2, and 15d-3 for every frequency system.

A delay time of one of the delay element chains 151-1, 151-2, and 151-3 of the phase difference detection circuits 15d-1, 15d-2, and 15d-3 of the systems is set in accordance with the ratio of the frequencies.

A detection portion is configured by the phase difference detection circuits 15d-1, 15d-2, and 15d-3, AND gates AD12-1 to AD12-n corresponding to the selecting means, and an encoder 16d.

As shown in FIG. 8, in the fifth embodiment, an LSI which operates by three kinds of clocks, 100 MHz, 50 MHz, and 25 MHz, is used as an example.

In this case, a delay time of one of the phase difference detection delay element chains (one chain step) is, assuming the 100 MHz system is 1, 2 in the 50 MHz system and 4 in the 25 MHz system.

Namely, when configuring one delay step of the 100 MHz system by one buffer, the 50 MHz system is configured by two buffers and the 25 MHz system is configured by four buffers.

Accordingly, by ANDing outputs of detection results of the phase difference detection circuits 15d-1, 15d-2, and 15D-3 of the frequency systems by AND gates AD12-1 to AD12-n, delay information of the path having the largest delay ratio to a clock cycle is output as the number of gates.

According to the fifth embodiment, by providing an LSI having a plurality of different frequencies with a delay element chain type phase difference detection circuit configured with a delay time adjustment step in accordance with the ratio of the frequencies, there is an advantage that it is possible to compare the phase difference between different frequencies regardless of the frequencies.

Summarizing the effects of the invention, as explained above, according to the present invention, by comparing a delay time of a critical path replica circuit and that of one clock cycle in a phase difference detection circuit using a delay element chain, it becomes possible to detect as fine as the phase difference corresponding to one delay element's worth of delay time.

Furthermore, since the delay element chain used in the phase difference detection circuit can be used in common as a delay element chain for setting a margin of the critical path replica circuit, the area of the circuit can be reduced.

Also, by indicating the phase difference information by the number of the delay elements, it is possible to set the amount of change of the power source voltage value in accordance with the difference with the desired number of the delay elements, so it is possible to shorten the convergence time until the optimal power source voltage value.

Furthermore, the optimal value can be set in accordance with the test results after producing the LSI since the optimal number of delay elements, that is, the optimal replica margin, can be set and the replica delay error can be corrected by a program in the processor.

Also, since both the delay element chain type phase difference detection circuit and the replica delay error correction circuit are used, a wide dynamic range of the phase difference detection circuit can be secured and the delay time of the replica circuit can be tuned.

Further, by providing a detecting means for detecting at least one delay time in the delay times corresponding to the excessively low voltage or excessively high voltage longer or shorter than a predetermined delay time for a clock cycle of the replica circuit, it is possible to shorten the convergence time in a case where a power source voltage deviates by a large extent from the optimal power source voltage.

Also, by detecting the phase difference by using replicas of a plurality of critical paths having different characteristics, it becomes possible to handle changes in the critical path due to a change of the power source voltage or processing content, so it becomes possible to guarantee a more reliable operation of the LSI.

Furthermore, by providing an LSI having a plurality of different frequencies with a delay element chain type phase difference detection circuit with a delay time adjustment step in accordance with the ratio of the frequencies, it is possible to compare the phase difference between different frequencies regardless of the frequencies.

While the invention has been described with reference to specific embodiment chosen for purpose of illustration, it should be apparent that numerous modifications could be made thereto by those skilled in the art without departing from the basic concept and scope of the invention.

What is claimed is:

1. A power source voltage controller comprising:

a semiconductor circuit having a critical path and operating by receiving a power source voltage supply;

a replica circuit coupled to the semiconductor circuit and having a power source voltage-delay characteristic approximately equivalent to that of the critical path of said semiconductor circuit, wherein the replica circuit receives a reference signal as an input, propagates said reference signal and outputs a delay signal;

a phase difference detection circuit for receiving the delay signal from said replica circuit and said reference signal, having a delay time monitor gauge for detecting a phase difference of the delay signal from the reference signal, and outputting the detection result as phase difference information corresponding to a delay time of the critical path of said semiconductor circuit; and a voltage control circuit for generating a voltage value based on the phase difference information from said phase difference detection circuit and supplying the same to said semiconductor circuit and the replica circuit.

2. A power source voltage controller as set forth in claim 1, wherein:
said delay time monitor gauge has a delay element chain comprised of a plurality of delay elements connected in series and p1 said phase difference detection circuit indicates said phase difference information by the number of delay elements.

3. A power source voltage controller as set forth in claim 2, wherein said voltage control circuit uses the delay element chain of said phase difference detection circuit as a delay margin and controls the delay margin by receiving said phase difference information.

4. A power source voltage controller as set forth in claim 1, comprising a pulse generator for generating a pulse, based on a clock of said semiconductor circuit, having the same length as one cycle of the clock for every several cycles and outputting it as said reference signal.

5. A power source voltage controller as set forth in claim 4, wherein said phase difference detection circuit comprises a detecting means for detecting at least one delay time in the delay times corresponding to an excessively low voltage or an excessively high voltage longer or shorter than a predetermined delay time for the clock cycle of the replica circuit.

6. A power source voltage controller as set forth in claim 4, wherein:
said delay time monitor gauge has a delay element chain comprised of a plurality of delay elements connected in series;
said phase difference detection circuit indicates said phase difference information by the number of delay elements.

7. A power source voltage controller as set forth in claim 6, wherein said voltage control circuit uses the delay element chain of said phase difference detection circuit as a delay margin and controls the delay margin by receiving said phase difference information.

8. A power source voltage controller as set forth in claim 7, wherein said phase difference detection circuit comprises a detecting means for detecting at least one delay time in the delay times corresponding to an excessively low voltage or an excessively high voltage longer or shorter than a predetermined delay time for the clock cycle of the replica circuit.

9. A power source voltage controller as set forth in claim 6, wherein said phase difference detection circuit comprises a detecting means for detecting at least one delay time in the delay times corresponding to an excessively low voltage or an excessively high voltage longer or shorter than a predetermined delay time for the clock cycle of the replica circuit.

10. A power source voltage detection circuit as set forth in claim 9, wherein
said phase difference detection circuit further comprises a delay gate connected to said delay element chain and
said detecting means detects a longer delay time than a predetermined delay time based on an output of said delay gate and detects a shorter delay time than a predetermined delay time based on a signal in a node in the middle of a signal propagation path of said replica circuit.

11. A power source voltage detection circuit as set forth in claim 9, wherein
said pulse generator generates at least one of a clock having an advanced phase and a clock having a delayed phase with respect to the clock of the semiconductor circuit and
said detecting means detects a shorter time than a predetermined delay time based on said clock having an advanced phase and detects a longer delay time than a predetermined time based on said clock having a delayed phase.

12. A power source voltage controller, comprising:
a semiconductor circuit having a critical path and operating by receiving a power source supply;
a replica circuit coupled to the semiconductor circuit and having a power source voltage-delay characteristic approximately equivalent to that of a critical path of said semiconductor circuit, wherein the replica circuit receives a reference signal as an output, propagates said reference signal and outputs a delay signal;
a phase difference detection circuit for receiving the delay signal from said replica circuit and said reference signal, having a delay time monitor gauge for detecting a phase difference of the delay signal from the reference signal, and outputting the detection result as phase difference information corresponding to a delay time of the critical path of said semiconductor circuit;
a voltage control circuit for generating a voltage value based on the phase difference information from said phase difference detection circuit and supplying the same to said semiconductor circuit and the replica circuit; and
a delay error correction circuit arranged at either an input side of the reference signal of said replica circuit and an output side of said delay signal and for correcting a delay error with the critical path.

13. A power source voltage controller as set forth in claim 12, wherein;
said delay time monitor gauge has a delay element chain comprised of a plurality of delay elements connected in series and
said phase difference detection circuit indicates said phase difference information by the number of delay elements.

14. A power source voltage controller as set forth in claim 13, wherein said voltage control circuit uses the delay element chain of said phase difference detection circuit as a delay margin and controls the delay margin by receiving said phase difference information.

15. A power source voltage controller as set forth in claim 12, comprising a pulse generator for generating a pulse, based on a clock of said semiconductor circuit, having a same length as one cycle of the clock for every several cycles and outputting it as said reference signal.

16. A power source voltage controller as set forth in claim 15, wherein said phase difference detection circuit comprises a detecting means for detecting at least one delay time in the delay times corresponding to an excessively low voltage or an excessively high voltage longer or shorter than a predetermined delay time for the clock cycle of the replica circuit.

17. A power source voltage controller as set forth in claim 15, wherein:
said delay time monitor gauge has a delay element chain comprised of a plurality of delay elements connected in series and
said phase difference detection circuit indicates said phase difference information by the number of delay elements.

18. A power source voltage controller as set forth in claim 17, wherein said voltage control circuit uses the delay element chain of said phase difference detection circuit as a delay margin and controls the delay margin by receiving said phase difference information.

19. A power source voltage controller as set forth in claim 18, wherein said phase difference detection circuit comprises a detecting means for detecting at least one delay time in the delay times corresponding to an excessively low voltage or an excessively high voltage longer or shorter than a predetermined delay time for the clock cycle of the replica circuit.

20. A power source voltage controller as set forth in claim 17, wherein said phase difference detection circuit comprises a detecting means for detecting at least one delay time in the delay times corresponding to an excessively low voltage or an excessively high voltage longer or shorter than a predetermined delay time for the clock cycle of the replica circuit.

21. A power source voltage detection circuit as set forth in claim 20, wherein said phase difference detection circuit further comprises a delay gate connected to said delay element chain and said detecting means detects a longer delay time than a predetermined delay time based on an output of said delay gate and detects a shorter delay time than a predetermined delay time based on a signal in a node in the middle of a signal propagation path of said replica circuit.

22. A power source voltage detection circuit as set forth in claim 20, wherein said pulse generator generates at least one of a clock having an advanced phase and a clock having a delayed phase with respect to the clock of the semiconductor circuit and said detecting means detects a shorter time than a predetermined delay time based on said clock having an advanced phase and detects a longer delay time than a predetermined time based on said clock having a delayed phase.

* * * * *